(12) United States Patent
Lin

(10) Patent No.: US 7,643,305 B2
(45) Date of Patent: Jan. 5, 2010

(54) SYSTEM AND METHOD OF PREVENTING DAMAGE TO METAL TRACES OF FLEXIBLE PRINTED CIRCUITS

(75) Inventor: Peng Cheng Lin, Cupertino, CA (US)

(73) Assignee: QUALCOMM MEMS Technologies, Inc., San Diego, CA (US)

(*) Notice: Subject to any disclaimer, the term of this patent is extended or adjusted under 35 U.S.C. 154(b) by 0 days.

(21) Appl. No.: 12/044,841

(22) Filed: Mar. 7, 2008

(65) Prior Publication Data

US 2009/0231816 A1  Sep. 17, 2009

(51) Int. Cl.
*G06F 1/16* (2006.01)
(52) U.S. Cl. ...................................... 361/749
(58) Field of Classification Search ................ 361/681, 361/679, 683, 749–751
See application file for complete search history.

(56) References Cited

U.S. PATENT DOCUMENTS

| | | | |
|---|---|---|---|
| 4,756,940 A * | 7/1988 | Payne et al. ................ 428/78 |
| 4,832,621 A | 5/1989 | Asai et al. |
| 4,850,883 A * | 7/1989 | Kabadi ...................... 439/67 |
| 4,954,789 A | 9/1990 | Sampsell |
| 5,004,639 A * | 4/1991 | Desai .......................... 428/138 |
| 5,394,297 A * | 2/1995 | Toedter ....................... 361/683 |
| 5,485,304 A | 1/1996 | Kaeriyama |
| 5,784,189 A | 7/1998 | Bozler et al. |
| 5,798,907 A * | 8/1998 | Janik ........................... 361/683 |
| 6,040,937 A | 3/2000 | Miles |
| 6,223,393 B1 * | 5/2001 | Knopf ........................... 16/366 |
| 6,252,298 B1 * | 6/2001 | Lee et al. ..................... 257/668 |
| 6,271,477 B1 * | 8/2001 | Carroll et al. ................ 174/254 |
| 6,483,037 B1 * | 11/2002 | Moore et al. ................. 174/254 |
| 6,574,033 B1 | 6/2003 | Chui et al. |
| 6,674,562 B1 | 1/2004 | Miles |
| 6,680,792 B2 | 1/2004 | Miles |
| 6,927,344 B1 * | 8/2005 | Gall et al. .................... 174/254 |
| 7,012,732 B2 | 3/2006 | Miles |
| 7,110,158 B2 | 9/2006 | Miles |
| 7,123,216 B1 | 10/2006 | Miles |
| 7,161,728 B2 | 1/2007 | Sampsell et al. |
| 7,238,891 B2 * | 7/2007 | Muenzberg ................... 174/255 |
| 7,310,179 B2 | 12/2007 | Chui et al. |
| 7,327,510 B2 | 2/2008 | Cummings et al. |
| 7,355,782 B2 | 4/2008 | Miles |

(Continued)

FOREIGN PATENT DOCUMENTS

EP          1 841 296          10/2007

(Continued)

OTHER PUBLICATIONS

Miles, MEMS-based interferometric modulator for display applications, Part of the SPIE Conference on Micromachined Devices and Components, vol. 3876, pp. 20-28 (1999).

(Continued)

*Primary Examiner*—Lisa Lea-Edmonds
(74) *Attorney, Agent, or Firm*—Knobbe Martens Olson & Bear LLP

(57) ABSTRACT

Stiffeners in are provided in a flexible printed circuit to prevent damages to leads and traces of the flexible circuit caused by bending, folding and other stresses.

25 Claims, 8 Drawing Sheets

U.S. PATENT DOCUMENTS

| | | | |
|---|---|---|---|
| 7,384,272 B2 * | 6/2008 | Na | 439/67 |
| 2004/0113250 A1 * | 6/2004 | Khandros et al. | 257/680 |
| 2005/0046922 A1 | 3/2005 | Lin et al. | |
| 2005/0285973 A1 * | 12/2005 | Singh et al. | 348/374 |
| 2006/0270232 A1 * | 11/2006 | Kawamura et al. | 438/690 |
| 2007/0049060 A1 | 3/2007 | Nakajima et al. | |
| 2007/0134473 A1 | 6/2007 | Kim | |
| 2007/0254117 A1 * | 11/2007 | Graydon et al. | 428/34.1 |
| 2008/0084601 A1 | 4/2008 | Miles | |
| 2008/0106784 A1 | 5/2008 | Chui et al. | |
| 2008/0191978 A1 | 8/2008 | Miles | |

FOREIGN PATENT DOCUMENTS

| | | |
|---|---|---|
| JP | 2002-062490 | 2/2000 |
| WO | WO 2004/054088 | 6/2004 |

OTHER PUBLICATIONS

Miles et al., 5.3: Digital Paper™ : Reflective displays using interferometric modulation, SID Digest, vol. XXXI, 2000 pp. 32-35.

International Search Report and Written Opinon for International application No. PCT/US2008/036225, mailed Jun. 16, 2009.

* cited by examiner

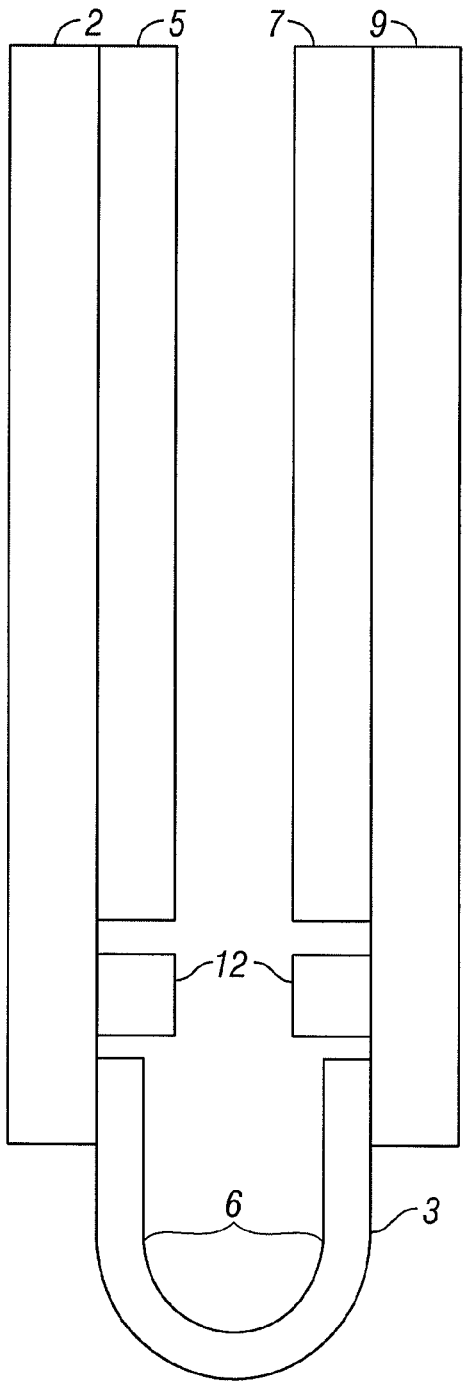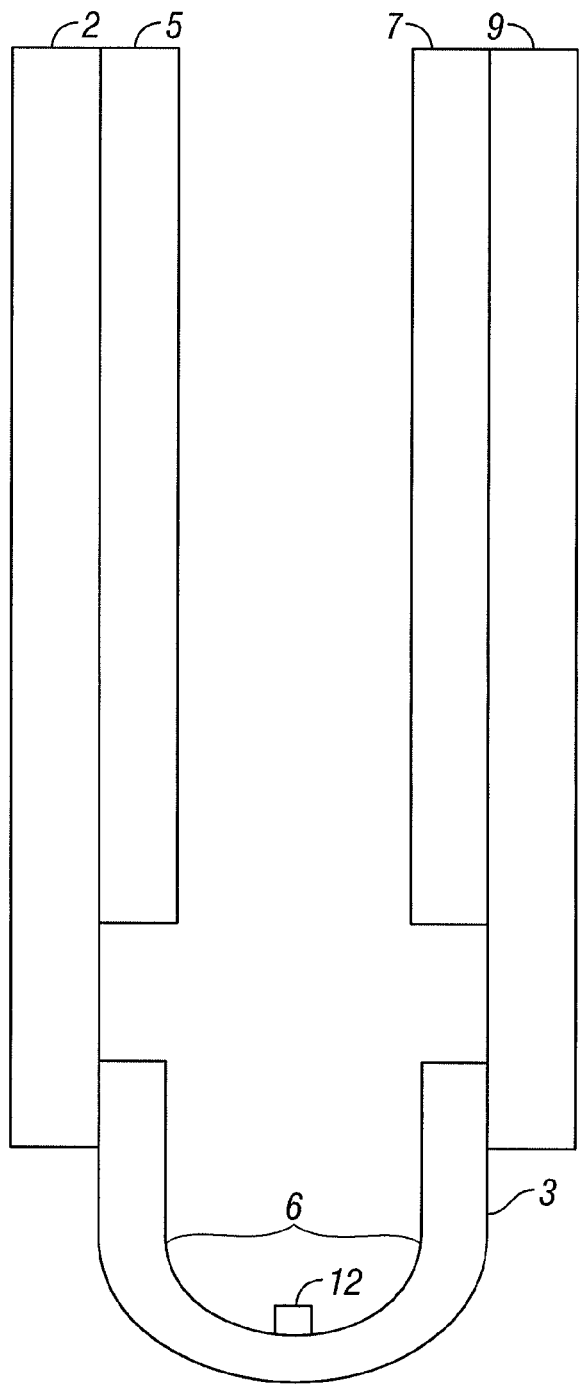
*FIG. 1B*     *FIG. 1C*

US 7,643,305 B2

SYSTEM AND METHOD OF PREVENTING DAMAGE TO METAL TRACES OF FLEXIBLE PRINTED CIRCUITS

BACKGROUND OF THE INVENTION

1. Field of the Invention

The invention concerns flexible printed circuits.

2. Description of the Related Art

Flexible printed circuits (FPCs) are electronic circuits that are commonly used in a variety of modern electronic devices. A flexible printed circuit has circuit traces and possibly electronic components deposited onto a flexible substrate. Flexible printed circuits typically comprise plastic substrates and etched thin metal foils and are so named because of their ability to bend or flex. They have the advantage of being thin, thus saving space, and of being easily moldable to the shape of the electronic device. They are often used to form a connection between two separate circuits.

SUMMARY OF THE INVENTION

In one embodiment, the invention comprises an electronic system comprising a panel and a flexible circuit connected to the panel. The flexible circuit comprises at least one stiffener, wherein the at least one stiffener resides in either one or both of a region where the flexible circuit crosses an edge of the panel such that the stiffener extends across the edge; and a region where the flexible circuit bends such that the stiffener extends around the bend. In another embodiment, an electronic system comprises a panel, a flexible circuit, and a means for stiffening a portion of the flexible circuit. Another embodiment comprises a method for preventing damage to metal conductors on or in a flexible circuit. The method comprises providing at least one stiffener at either one or both of a region where the flexible circuit overlaps a panel edge, and a region where the flexible circuit is bent.

BRIEF DESCRIPTION OF THE FIGURES

Exemplary embodiments of the invention are explained in greater detail in the following description and are illustrated in the drawings, in which:

FIGS. 1*a-c* show a cross-sectional view of a flexible circuit attached to a display panel;

DETAILED DESCRIPTION

Flexible circuits are often used to form a connection between separate components of a device. For example, a flexible circuit may be used to connect a power module to another component used by an electronic device. The inventors manufactured a display for use in an electronic device. The display used a flexible circuit to connect a display array to a module that provides power to the display and provides control signals to control the images displayed by the display array. The flexible circuit was connected to the display array and the control components during the assembly process.

Figure 1A:
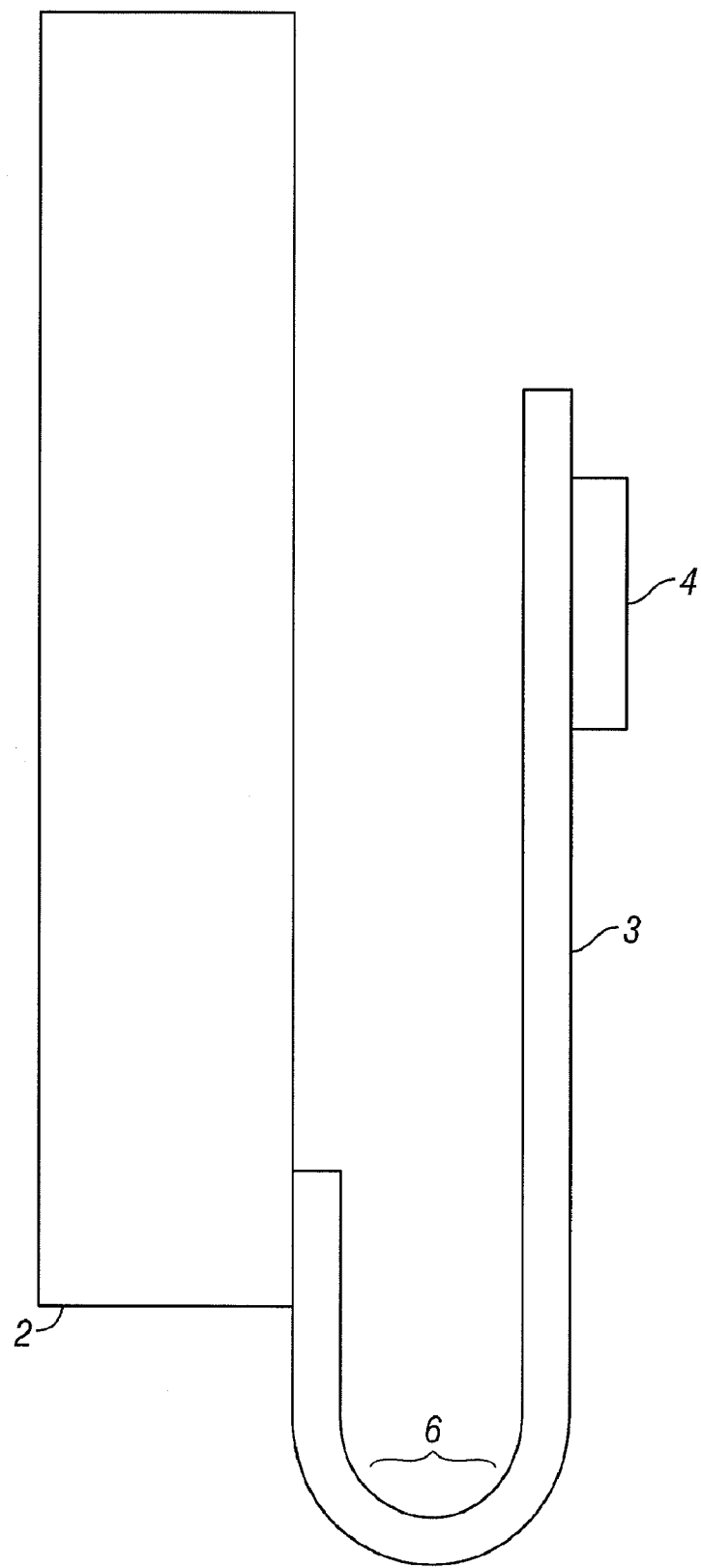

FIG. 1A represents a side cross-section view of an example of a flexible circuit and panel that was used in an electronic device. The flexible circuit 3 is connected to a panel 2. The panel 2 may comprise a display array including but not limited to LCD displays or micro-electromechanical system (MEMS) displays. The flexible circuit is bent at bend region 6 and is connected to the other components of the electronic device through connector 4.

FIG. 1B represents a side cross-section view of another example of a flexible circuit and panel that was used in an electronic device. Flexible circuit 3 is connected to panels 2 and 9. Panels 2 and 9 have glass covers 5 and 7. Components 12 are placed above the region where the flexible circuit 3 connects to panels 2 and 9. The flexible circuit 3 is bent at bend region 6.

FIG. 1C represents a side cross-section view of another example of a flexible circuit and panel that was used in an electronic device. Flexible circuit 3 is connected to panels 2 and 9. Panels 2 and 9 have glass covers 5 and 7. The flexible circuit is bent at bend region 6 and a component 12 is located within bend region 6.

However, after construction electronic devices in this manner, it was discovered that there was a high incidence of failure in the display arrays of the electronic device. Due to the high failure rate, manufacturing costs of the electronic device were increased.

Figure 2:
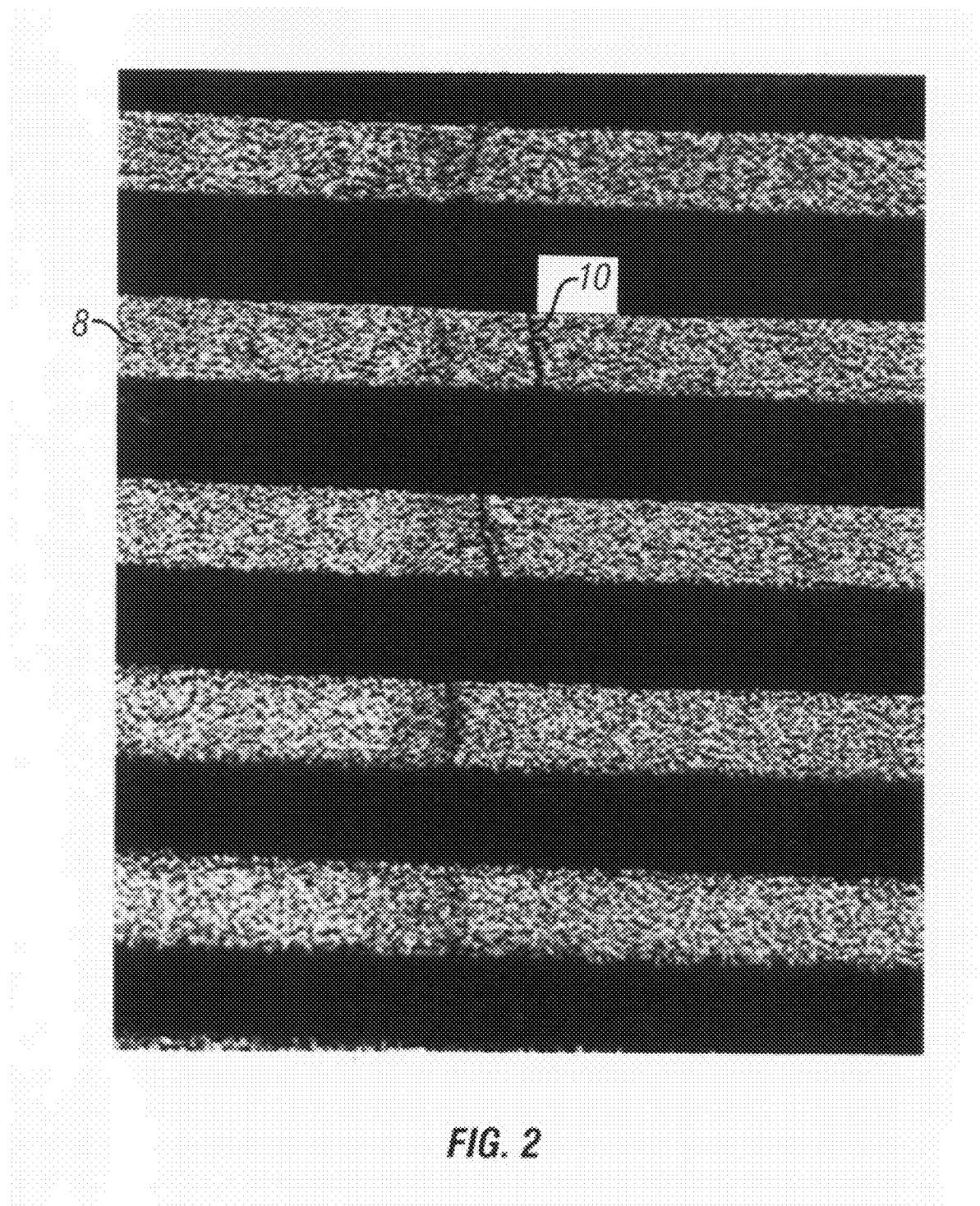
FIG. 2 shows a close up view of the micro-cracks that appear in the metal races of flexible circuits.

After careful analysis as to the cause of the display array failures, the inventors discovered microscopic cracks in the metal traces that ran through the flexible circuit which connected the display arrays to the control and power module. FIG. 2 shows a close up view of the micro-cracks that occur in the metal traces of the flexible circuit. Metal trace 8 runs through the enlarged section of the flexible circuit and micro-crack 10 has occurred in metal trace 8. Upon further analysis, it was discovered that the microscopic cracks were induced during the assembly and test process. In the assembly and test process the flexible circuit was often bent, twisted or curved in order to position it correctly with respect to the rest of the electronic device. If the flexible circuit was bent or twisted too much, microscopic cracks would occur in the metal traces of the flexible circuit. Such bending, twisting or curving of the flexible circuit is often unavoidable during the manufacturing and testing of the electronic device. Furthermore, the traces may be weakened at the bend region when a permanent bend is required by subsequent display module integration and assembly. It would be preferred if the stresses resulting from the bending, twisting or deviating the flexible circuit from a flat linear profile could be reduced to the point where the stresses would no longer cause micro-cracks in the metal traces.

Figure 3:
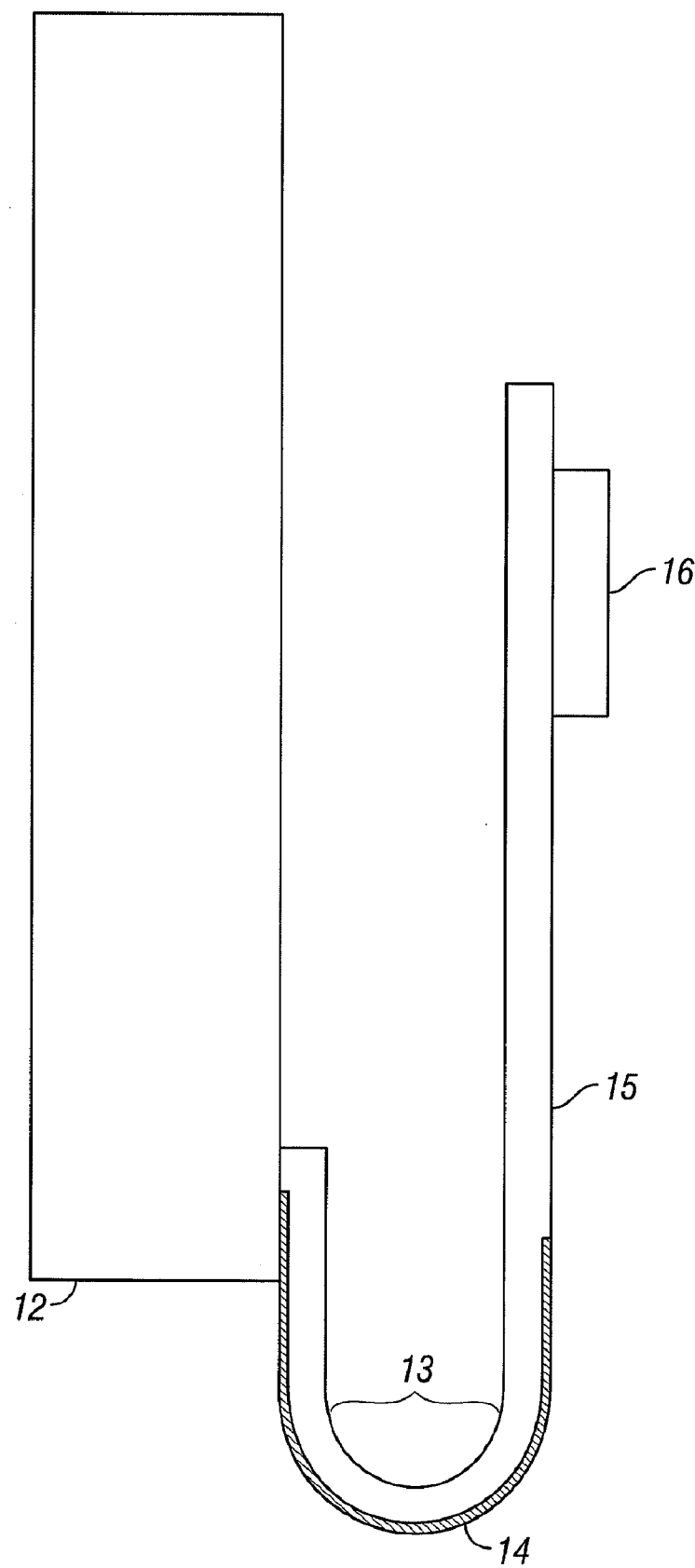
FIG. 3 shows a cross-sectional view of a flexible circuit according to one embodiment of the invention.

FIG. 3 represents a side cross-section view of a flexible circuit and panel according to an embodiment of the invention. Flexible circuit 15 is connected to panel 12. Panel 12 may comprise a display array. Flexible circuit 15 is bent at a bend region 13. One or more stiffeners 14 are placed at the bend region of flexible circuit 22 as is also shown in FIGS. 4-8, and at the region where the flexible circuit overlaps panel 12. A "bend region" refers to any region where a flexible circuit is curved, bent, twisted or otherwise deviates from a flat linear profile. The bend region may occur anywhere in the flexible circuit and is generally defined by the display module manufacturing process using the flexible circuit. FIG. 3 is a cross section view of the flexible circuit 15, and only shows the placement of stiffeners 14 in the cross section view. As FIG. 3 shows, the stiffener 14 overlaps with the edge of the display panel 12. There may be multiple stiffeners 14 placed along the edges or within the central region of the flexible circuit 15. FIGS. 4, 5, 6, 7, and 8 show example placements of the stiffeners 14. The flexible circuit 15 is connected to the other components of the electronic device through connector 16.

Figure 4:
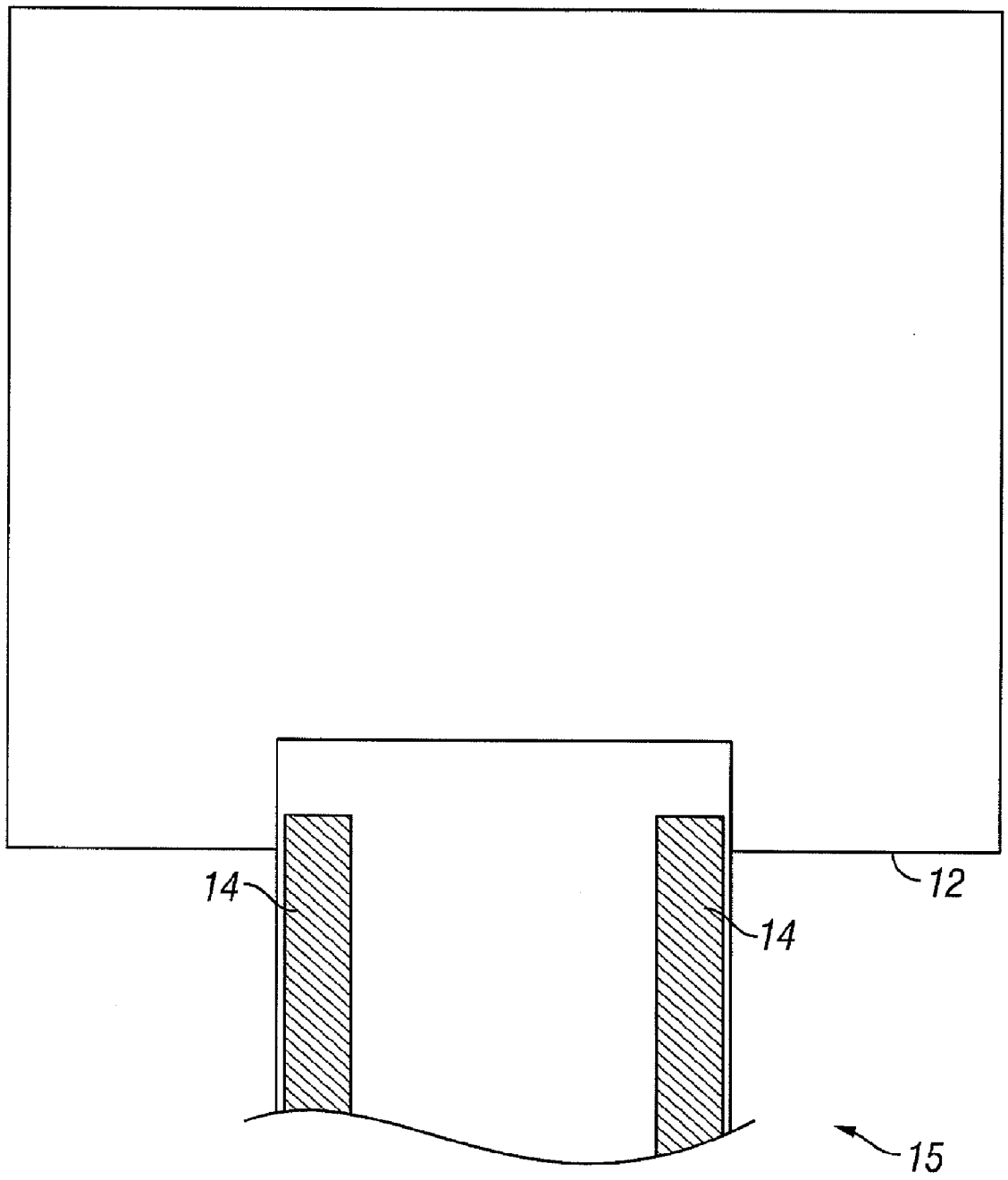
FIG. 4 shows a top view of the flexible circuit of FIG. 3.

FIG. 4 schematically shows a top view of the flexible circuit of FIG. 3. Flexible circuit 15 is connected to panel 12. Panel 12 may comprise a display array. Stiffeners 14 reside in the region where the flexible circuit crosses an edge of panel 12 such that the stiffeners extend across the edge of panel 12 and such that they are along the edge of flexible circuit 15.

Figure 5:
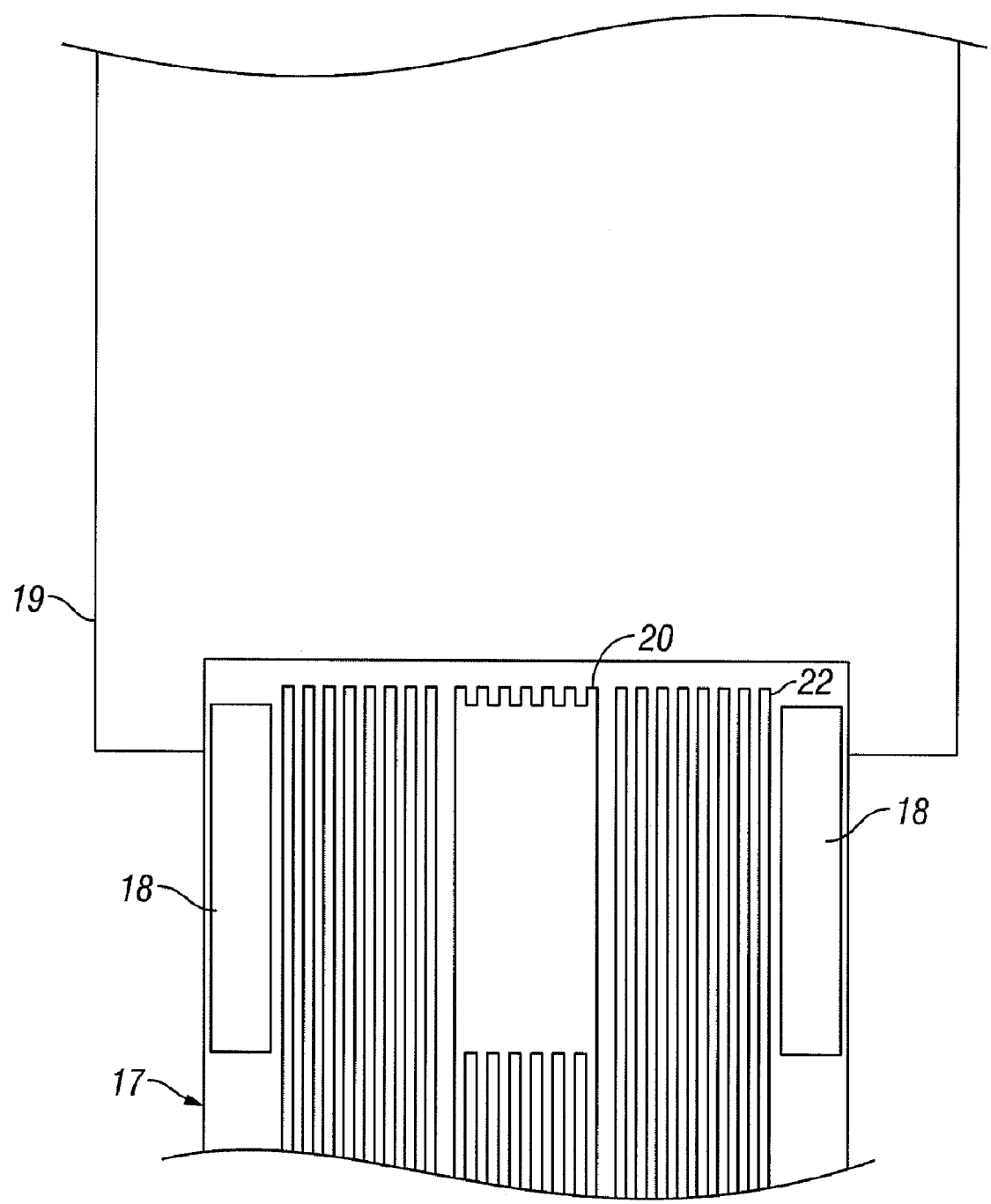
FIG. 5 shows a top view of a flexible circuit according to another embodiment of the invention.

FIG. 5 schematically represents the flexible circuit and panel according to another embodiment of the invention. Flexible circuit 17 is connected to panel 19. Stiffeners 18 reside in the region where the flexible circuit crosses the edge of panel 19 such that the stiffeners may extend across the edge of panel 19, or may be very near the edge of panel 19. Stiffeners 18 are on or near the edge of flexible circuit 17. Stiffener 20 resides along an inner portion of the flexible circuit 17, and may be combined with the flexible circuit metal traces. Please note that there are multiple locations where the stiffeners 18 and 20 may reside and these locations are not limited to what is shown in FIG. 5. For example, an embodiment of the invention may not place any stiffeners 20 in the central region of the flexible circuit 17 and only place stiffeners 18 along the edges of the flexible circuit 17. Another embodiment may not place any stiffeners 18 along the edges of flexible circuit 17 but only place one or more stiffeners 20 along a central portion of flexible circuit 17.

Figure 6:
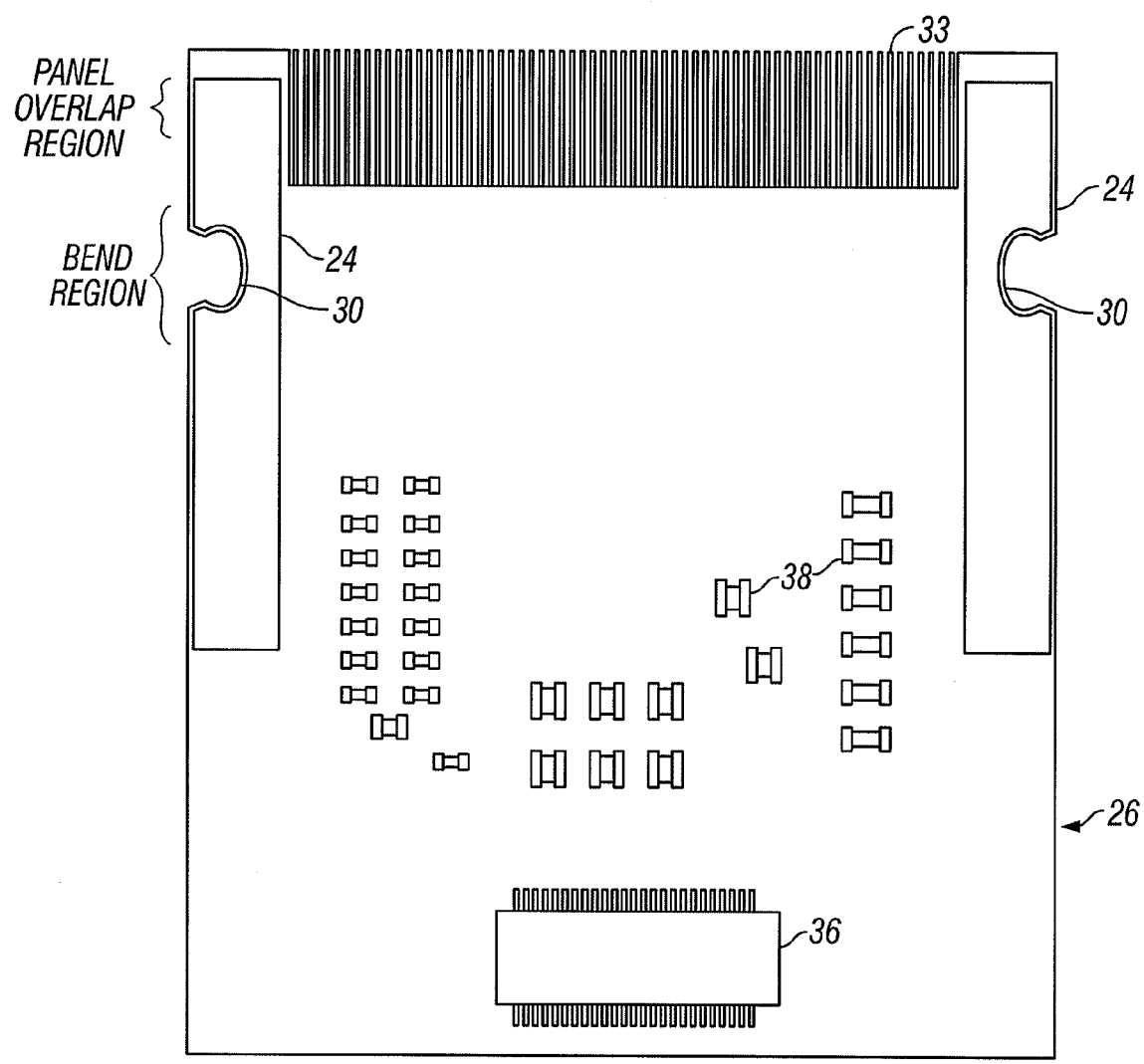
FIG. 6 shows a top view of a flexible circuit according to a certain embodiment of the invention.

FIG. 6 shows one embodiment of a flexible circuit 26 according to another embodiment of the invention. Stiffeners 24 reside along the edge of flexible circuit 26. Notches 30 are cut into the flexible circuit 26 to define a bend region 32 for flexible circuit 26. The flexible circuit may be bent at the bend region as shown in FIG. 3. Flexible circuit 26 is connected to other components of the electronic device through connector 36. Additionally, the flexible circuit 26 has mounts 38 for passive components including but not limited to resistors and capacitors.

Figure 7:
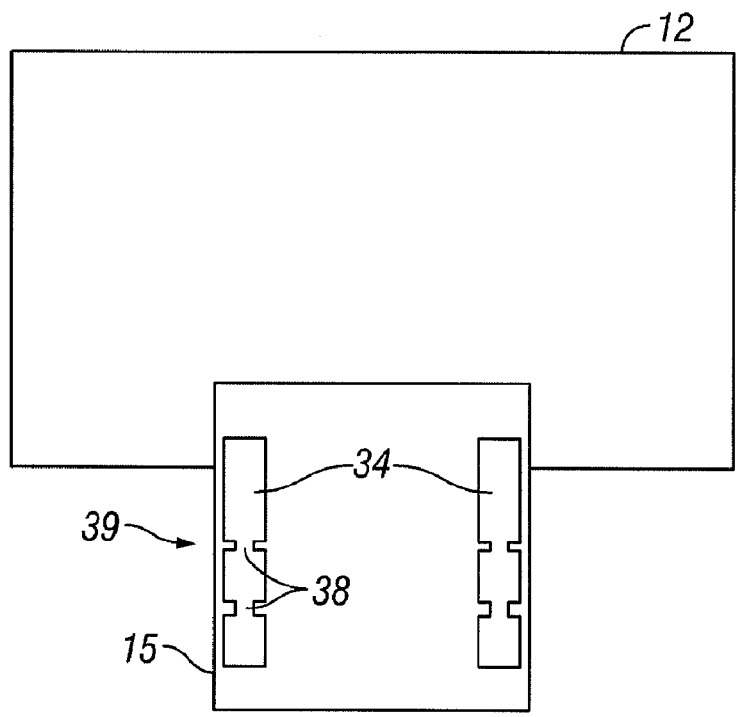
FIG. 7 shows a top view of a flexible circuit according to one embodiment of the invention.

FIG. 7 shows another embodiment of a flexible circuit 15 according to another embodiment of the invention. Flexible circuit 15 is connected to panel 12. Stiffeners 34 reside near the edges of flexible circuit 15. Stiffeners 34 are continuous and have three rectangular sections that are connected by necks 38. The necks 38 may define one or more bend regions 39 for the flexible circuit 15.

Figure 8:
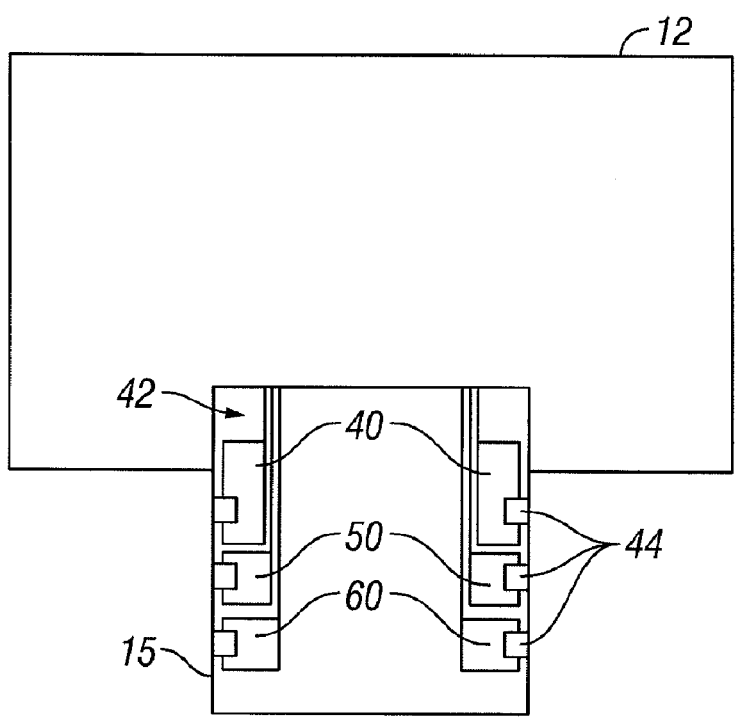
FIG. 8 shows a top view of a flexible circuit according to one embodiment of the invention.

FIG. 8 shows another embodiment of a flexible circuit 15 according to another embodiment of the invention. Flexible circuit 15 is connected to panel 12. Stiffeners 40, 50 and 60 reside near the edges flexible circuit 15. Stiffeners 40, 50 and 60 are discrete and are not connected to each other. In addition, the gaps between stiffeners 40, 50 and 60 may define one or more bend regions 39 for the flexible circuit 15.

Stiffeners 14, 18, 20, 24, 34, 40, 50, and 60 may be connected to grounding planes, connected to power sources, connected to test traces, or connected to signal sources.

The stiffeners 14, 18, 20, 24, 34, 40, 50, and 60 will stiffen the flexible circuits 15, 17, and 26 in the regions where they are placed. The stiffeners 14, 18, 20 and 24 will absorb the strenuous bending stresses and increase the flexural strength, tensile strength and elasticity of the flexible circuit. This stiffening of the flexible circuits 15, 17, and 26 helps prevent damages to traces 22 and 33 as it prevents the flexible circuits 15, 17, and 26 from being bent or twisted to the point where it damages traces 22 and 33. Bending of a flexible circuit may occur in a variety of stages during the construction of electronic devices that use flexible circuits, for example, installation and testing stages.

Stiffeners 14, 18, 20, 24, 34, 40, 50, and 60 in FIGS. 3, 4, 5, 6, 7, and 8 may be any shape or form. For example, the stiffeners may be rectangular, circular, oval shaped or triangular. The invention is not in any way limited to a particular shape or form of the stiffeners. In addition, stiffeners 14, 18, 20, 24, 34, 40, 50, and 60 in FIGS. 3, 4, 5, 6, 7, and 8 may be continuous or may be divided into discrete portions as shown in FIGS. 7 and 8 respectively.

Stiffeners 14, 18, 20, 24, 34, 40, 50, and 60 in FIGS. 3, 4, 5, 6, 7, and 8 may be created during the manufacturing process of the flexible circuits 15, 17, and 26. In general, flexible circuits are manufactured by depositing a layer of conductive material onto a flexible substrate or with copper foil on a base film. The conductive layer or the copper foil is then subjected to an etching process which etches away the portions of the conductive layer that may or may not be used by the circuit. The stiffeners 14, 18, 20 and 24 may be created during this etching process. In conventional manufacturing methods, the entire excess of the conductive layer was etched away. In the new method, strips of the conductive layer will not be etched in order to retain metal strips to form the stiffeners. As will be understood by those of skill in the art, plating on the stiffeners can be achieved to produce the same surface finish as on the rest of the traces if the plating bus 44 is extended to the stiffeners and with a trace 42 attached to each stiffener. This method of creating the stiffeners allows the stiffeners to be added to the flexible circuit at no additional cost and does not require any changes to the overall manufacturing method of the flexible circuit.

Please note that the invention is not limited to any of the above embodiments and may be applied to any electronic device that uses a flexible printed circuit.

What is claimed is:

1. An electronic system comprising:
at least one panel;
at least one flexible circuit connected to the panel;
the flexible circuit comprising at least one stiffener, wherein the stiffener is co-planar with traces of the flexible circuit, wherein the stiffener is positioned along a central portion of the flexible circuit and parallel to an edge of the flexible circuit, and wherein the at least one stiffener resides in either one or both of:
a region where the flexible circuit crosses an edge of the panel such that the stiffener extends across the edge; and
a region where the flexible circuit bends such that the stiffener extends around the bend.

2. The electronic system of claim 1 wherein the stiffener is positioned along an edge of the flexible circuit.

3. The electronic system of claim 1 wherein the panel comprises a display array.

4. The electronic system of claim 1 wherein the flexible circuit comprises notches in the region where the stiffener is present.

5. The electronic system of claim 1 wherein the stiffener comprises metal.

6. The electronic system of claim 5 wherein the stiffener comprises copper.

7. The electronic system of claim 5 wherein the stiffener is grounded.

8. The electronic system of claim 5 wherein the stiffener is connected to a signal source.

9. The electronic system of claim 5 wherein the stiffener is connected to a power source.

10. The electronic system of claim 5, wherein the stiffener is connected to a test trace.

11. The electronic system of claim 1, wherein the stiffener is rectangular in shape.

12. The electronic system of claim 1, wherein the stiffener is not rectangular in shape.

13. The electronic system of claim 1, wherein a neck connects two sections of the stiffener to form a region where the flexible circuit is bent.

14. The electronic system of claim 5 wherein the stiffener is one millimeter to two millimeters in width.

15. A electronic system comprising:
at least one panel;
at least one flexible circuit; and
means for stiffening a portion of the flexible circuit wherein the means for stiffening is co-planar with traces of the at least one flexible circuit and wherein the means for stiffening is positioned along a central portion of the flexible circuit and parallel to an edge of the flexible circuit.

16. The electronic system of claim 15 wherein the panel comprises a display array.

17. The electronic system of claim 15 wherein the flexible circuit comprises notches in the region where the stiffening means is present.

18. The electronic system of claim 15 wherein the stiffening means comprises a metal strip.

19. The electronic system of claim 15 wherein the stiffening means comprises copper.

20. A method for preventing damage to metal conductors on or in a flexible circuit, the method compromising providing at least one stiffener at either one or both of a region where the flexible circuit overlaps a panel edge, and a region where the flexible circuit is bent wherein the at least one stiffener is co-planar with traces of the flexible circuit and wherein the at least one stiffener is positioned along a central portion of the flexible circuit and parallel to an edge of the flexible circuit.

21. The method of claim 20 comprising forming the stiffener by retaining metallic strips during an etching processing during fabrication of the flexible circuit.

22. The method of claim 20 comprising placing notches on the flexible circuit in a region where the flexible circuit is bent.

23. An electronic system comprising:
at least one panel;
at least one flexible circuit connected to the panel;
the flexible circuit comprising at least one stiffener, wherein the stiffener is co-planar with traces of the flexible circuit, wherein the at least one stiffener is connected to at least one of a power source, a signal source, and a test trace, and wherein the at least one stiffener resides in either one or both of:
a region where the flexible circuit crosses an edge of the panel such that the stiffener extends across the edge; and
a region where the flexible circuit bends such that the stiffener extends around the bend.

24. A electronic system comprising:
at least one panel;
at least one flexible circuit; and
means for stiffening a portion of the flexible circuit wherein the means for stiffening is co-planar with traces of the at least one flexible circuit and wherein the means for stiffening is connected to at least one of a power source, a signal source, and a test trace.

25. A method for preventing damage to metal conductors on or in a flexible circuit, the method compromising providing at least one stiffener at either one or both of a region where the flexible circuit overlaps a panel edge, and a region where the flexible circuit is bent wherein the at least one stiffener is co-planar with traces of the flexible circuit and wherein the at least one stiffener is connected to at least one of a power source, a signal source, and a test trace.

* * * * *